United States Patent
Whitlock

(10) Patent No.: US 7,184,470 B2
(45) Date of Patent: Feb. 27, 2007

(54) METHOD AND APPARATUS FOR MEASUREMENT OF JITTER

(75) Inventor: Malcolm Whitlock, Eastleigh (GB)

(73) Assignee: Exfo Europe Limited (GB)

( * ) Notice: Subject to any disclaimer, the term of this patent is extended or adjusted under 35 U.S.C. 154(b) by 724 days.

(21) Appl. No.: 10/021,736

(22) Filed: Oct. 30, 2001

(65) Prior Publication Data

US 2002/0118738 A1    Aug. 29, 2002

(30) Foreign Application Priority Data

Oct. 31, 2000    (GB) ................................. 0026556.1

(51) Int. Cl.
    *H04B 3/46* (2006.01)
(52) U.S. Cl. .................. 375/226; 375/371; 702/69; 324/622
(58) Field of Classification Search ................ 375/118, 375/110, 113, 226, 371, 373, 376, 120, 359, 375/360, 238; 331/45, 57, 4; 368/113, 118, 368/121; 455/260; 968/844; 324/76.77, 324/76.13, 622, 617; 370/516; 702/176, 702/69, 66, 106, 124, 190, 79; 327/100; 369/54; 708/207, 443; 714/700; 376/371, 376/226

See application file for complete search history.

(56) References Cited

U.S. PATENT DOCUMENTS

| | | | | |
|---|---|---|---|---|
| 4,164,648 A | * | 8/1979 | Chu .............................. | 377/20 |
| 4,975,634 A | * | 12/1990 | Shohet ...................... | 324/76.77 |
| 5,293,520 A | * | 3/1994 | Hayashi .................... | 324/76.77 |
| 5,400,370 A | * | 3/1995 | Guo ........................... | 375/371 |
| 5,557,196 A | * | 9/1996 | Ujiie ........................ | 324/76.77 |
| 5,748,672 A | * | 5/1998 | Smith et al. ................. | 375/226 |

(Continued)

FOREIGN PATENT DOCUMENTS

EP        1 096 263 A2    5/2001

(Continued)

OTHER PUBLICATIONS

Time domain analysis & its practical application to measurement of phase noise & jitter; Cosart, L.D. et al; Instrumentation & Measurement Tech. Conf., IMTC-96. 'Quality Measurements: The Bridge between Theory & Reality'., IEEE , vol. 2,1996, p. 1430-35.*

(Continued)

*Primary Examiner*—Temesghen Ghebretinsae
(74) *Attorney, Agent, or Firm*—Fitch, Even, Tabin & Flannery

(57) ABSTRACT

A method and circuit for measurement of jitter in which a reference clock (404) runs at a frequency offset to the incoming signal (I) so that the phase of the two clocks drift over time, enabling detection of jitter in the input signal by measurement of the difference in the number of clock cycles it takes for this drift to occur.

This design provides the following advantages:
  It does not require analogue circuitry and, because the frequency offset can be large and still function, the reference frequency can be produced by a programmable oscillator.
  With the exception of the programmable oscillator the entire design can be implemented within an FPGA.
  It requires no parts (such as a jitter attenuator or phase locked loop) designed to operate at a specific frequency and therefore this design can operate over an extremely wide frequency range.

17 Claims, 3 Drawing Sheets

U.S. PATENT DOCUMENTS

| | | | |
|---|---|---|---|
| 5,923,706 A * | 7/1999 | Marz | 375/226 |
| 6,246,737 B1 * | 6/2001 | Kuglin | 375/371 |
| 6,295,315 B1 * | 9/2001 | Frisch et al. | 375/226 |
| 6,356,850 B1 * | 3/2002 | Wilstrup et al. | 702/69 |
| 6,366,631 B1 * | 4/2002 | Nakayama et al. | 375/371 |
| 6,377,644 B1 * | 4/2002 | Naudet | 375/371 |
| 6,460,001 B1 * | 10/2002 | Yamaguchi et al. | 702/69 |
| 6,621,767 B1 * | 9/2003 | Kattan | 368/113 |
| 6,795,496 B1 * | 9/2004 | Soma et al. | 375/226 |
| 2001/0044701 A1 * | 11/2001 | Ballantyne et al. | 702/79 |

FOREIGN PATENT DOCUMENTS

WO     WO 99/57842     11/1999

OTHER PUBLICATIONS

A high resolution time measurement system; Yamaguchi, Y. et al; Instrumentation and Measurement Technology Conference, 1991. IMTC-91. Conference Record., 8th IEEE, May 14-16, 1991 pp. 618-621.*

* cited by examiner

METHOD AND APPARATUS FOR MEASUREMENT OF JITTER

FIELD OF THE INVENTION

This invention relates to measuring the amount of jitter present on a digital signal. Ideally, in a digital signal transitions between different levels occur at precise times; however, in practice the actual time at which a transition occurs may vary slightly from the ideal. Such variations are commonly referred to as jitter.

BACKGROUND OF THE INVENTION

In the field of this invention it is known that the normal method of measuring jitter is to use an analogue based system implemented with a Phase Locked Loop (PLL) which tracks the input signal, therefore resulting in the PLL's oscillator control voltage containing imposed thereon an analogue representation of the jitter component of the input signal. This PLL oscillator control voltage signal can then be filtered and its level can be displayed. However, such an approach is subject to the disadvantages inherent in analogue circuitry, such as high cost, difficulty in achieving desired accuracy of performance through need to match exact performance of analogue components and lack of performance stability over changes in temperature and time.

Another method (known from patent publication WO 99/57842) of measuring jitter, using a digital approach, is to track the incoming signal with a PLL, to produce a very low frequency offset (e.g., 1.27 parts per million (ppm) and to count the number of coincidences of phasing for each sample period together with the time between these coincidences.

However, this approach requires separate analogue circuitry, a phase locked loop and jitter attenuator, and the input signal frequency needs to be tracked by this PLL with an extremely small offset (1.27 ppm) in order to work.

A need therefore exists for an apparatus and method for measurement of jitter wherein the abovementioned disadvantage(s) may be alleviated.

STATEMENT OF INVENTION

In accordance with a first aspect of the present invention there is provided a method for measurement of jitter.

In accordance with a second aspect of the present invention there is provided an apparatus for measurement of jitter.

It will be understood that the invention allows measurement of jitter in a digital signal without need for high frequency clocking, Phase Locked Loops (PLLs) or similar analogue circuitry. This enables it to be implemented completely within a Field Programmable Gate Array (FPGA) with the need of just an external programmable oscillator.

It will be further understood that the invention does not rely on having to track the input signal accurately, and although it may require the ability to measure the frequency of the input signal this can be performed using a simple frequency counter (e.g., within the FPGA).

BRIEF DESCRIPTION OF THE DRAWINGS

One method and apparatus for measurement of jitter incorporating the present invention will now be described, by way of example only, with reference to the accompanying drawings, in which.

DESCRIPTION OF PREFERRED EMBODIMENT

In essence, the preferred embodiment of the present invention utilizes a technique in which a programmable oscillator (reference clock) runs at a slightly different frequency (offset) to the incoming signal so that the phase of the two clocks drift over time, enabling detection of jitter in the input signal by measurement of the difference in the number of clock cycles it takes for this drift to occur.

A frequency counter is used to measure the frequency of the input signal and then the programmable oscillator (reference clock) is set to a frequency with a fixed offset. If the input frequency is exactly 2,048,000 Hz then setting the programmable oscillator to 2,027,723 Hz (100/101) times this frequency would take 100 reference clocks (101 input signal clocks) for the signals to change phase by exactly 100%. Any jitter present on the input signal would cause a change in the number of clock cycles required for this phase change. Because the jitter can have a wideband frequency component it is necessary to perform multiple measurement cycles, for a single test, all based on the original reference point to catch the peaks of the jitter component.

This technique detects a phase match and then from the calculated offset frequency determines the exact number of clock cycles required to the next phase match for a jitterless signal. Using this calculated value, many cycles are performed and if jitter is present then for each cycle the number of clock pulses require to reach a phase match will be different. It is also important to understand that as these cycles are referenced to just the first phase match and not subsequent matches, the phase match at the start of each cycle will not occur in the same place; therefore a cycle counter must not be reset to these matches but to the calculated position.

By storing maximum and minimum values in the counter when a phase match is detected the total phase variation can be calculated at the end of the test. When very high frequency jitter is present many phase matches will be detected within each measurement cycle; however, they are all valid and therefore the first (minimum) and last (maximum) must be stored. As there will be jitter all through the input signal, the beginning of the measurement cycle will also have phase matches occurring at different positions and these need to be blocked so that they do not effect the stored maximum and minimum values.

Figure 1:
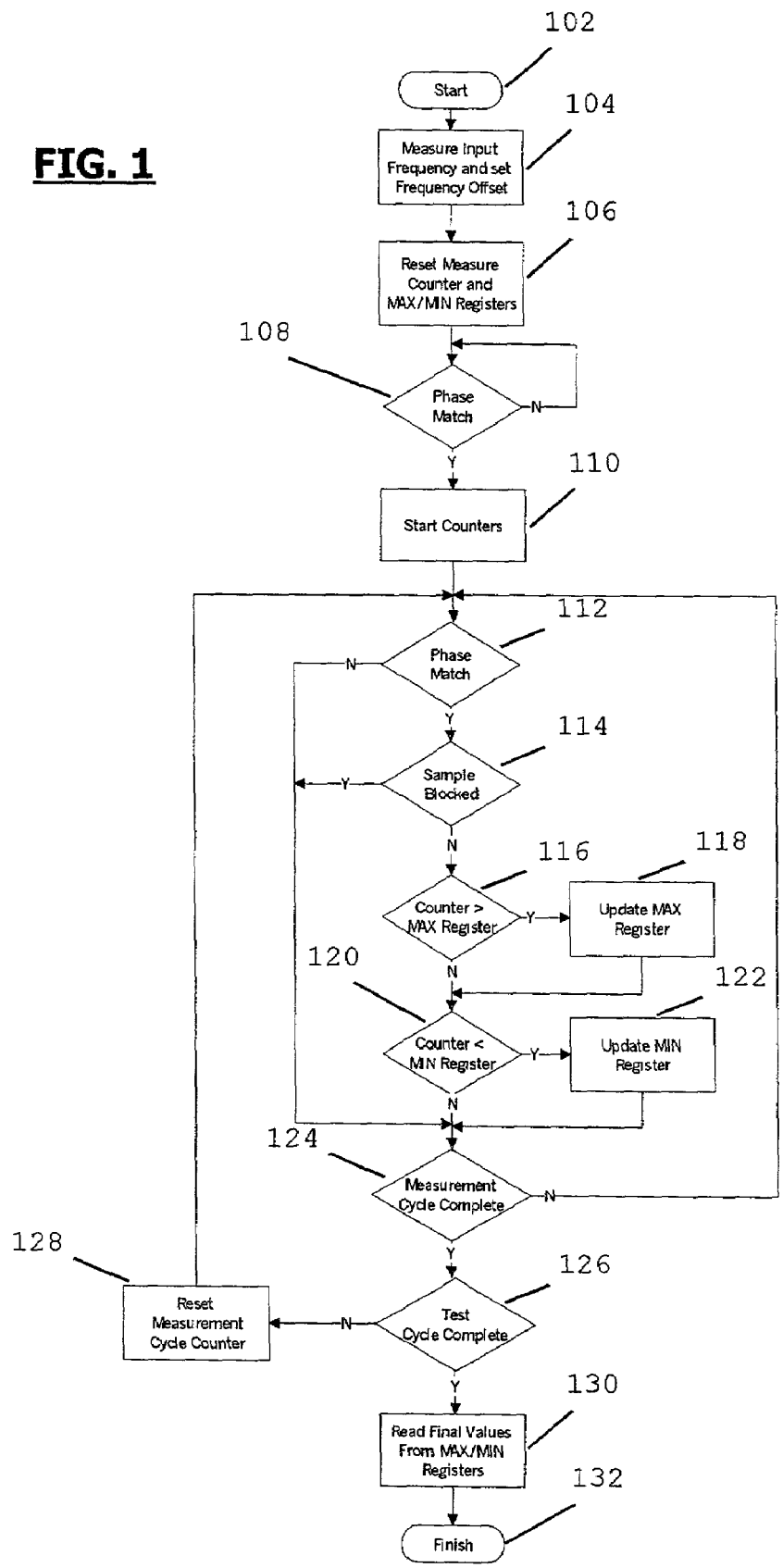
FIG. 1 shows a flow chart illustrating the method for measurement of jitter.

Referring now particularly to FIG. 1, the method based on the above technique involves two main timing cycles:

1. The measurement cycle set by the frequency offset; this is 200 clock cycles for the above example but can be any value that suits the resolution of the jitter to be measured. This is set to twice the actual phasing period so that excursions greater than the calculated value can be captured.
2. The test cycle, which determines the low cutoff frequency of the measurement, which is a multiple of the phase repetition cycle.

After start (step 102) of the method, the frequency (e.g., 2,048,000 Hz) of the input signal (whose jitter is to be measured) is measured and the offset frequency (e.g., 2,027, 723 Hz) is calculated and an appropriate reference clock signal is produced at this offset frequency (step 104).

To measure the peak maximum and peak minimum jitter two registers (MAX and MIN) are used, and at the start of the jitter measurement the MAX register is reset to zero and the MIN register is set to its maximum possible reading (step 106). A phase match 'wait loop' (step 108) is then followed until a phase match occurs, i.e., until both the input signal and the reference clock are exactly in phase (this match may conveniently be performed by detecting the coincidence of the rising edge of both the input signal and the reference clock, but it will be understood that 'falling edge' or other methods of phase comparison may alternatively be used).

Two counters, a measurement counter and a test cycle counter, are reset to zero and begin incrementing by the reference clock signal (step 110). Each time the reference and input signals are again exactly in phase (step 112), if the sample is not blocked (step 114, which will be explained in more detail below) the value in the measurement counter is compared with the values in the MAX and MIN registers. If the measurement counter value is higher than the value in the MAX register (step 116), the MAX register is updated (step 118); and if the measurement counter value is low than the value is the MIN register (step 120), the MIN register is updated (step 122). This ensures that each time phase coincidence occurs the minimum and maximum excursions are retained.

As mentioned above, a blocking pulse is produced (step 114) so that any phase match at or near to the start/end of the test cycle is not detected. For the example described above where the test cycle is 200 clocks the blocking pulse would only allow coincidence occurring between say clock cycled 50 and 150 to update the MAX & MIN registers. The measurement counter continues to increment, being reset to zero when it reaches its calculated limit (step 124) as many times as defined by the test cycle to give the required low frequency cutoff.

When the measurement cycle counter reaches twice the calculated phasing position (step 126), it is reset (step 128) and the next measurement cycle begins. This allows for MAX (positive peak) jitter to be detected which will is later than the expected position. It is important that each measurement cycle is referenced to the original phase coincidence and not reset, otherwise both high and low frequency limits would be imposed. To overcome the possibility of not being able to detect fixed frequency jitter based on a frequency that would beat with the offset frequency, the offset frequency can be changed between test cycles if necessary. The final values are then read from the MAX and MIN registers (step 130), and the total peak-to-peak jitter is calculated by subtracting the value in the MIN register from the value in the MAX register and dividing this difference by the calculated number of clock cycles between phase matches. Ultimately, the method ends at step 132.

Figure 2:
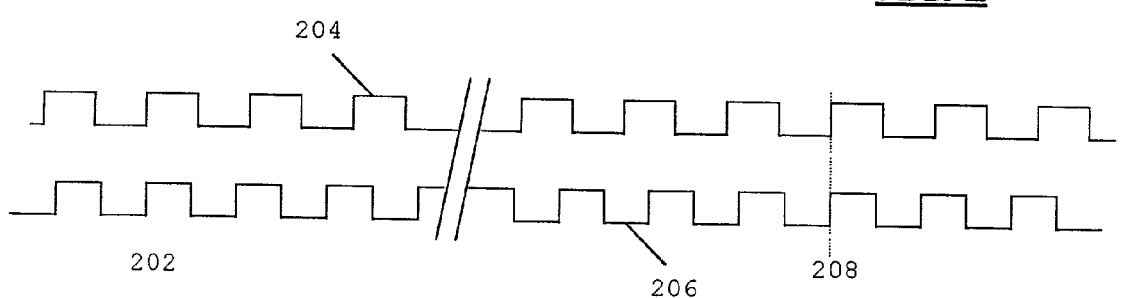
FIG. 2 shows a digital signal waveform diagram illustrating the absence of jitter.

FIG. 2 shows how the phasing affects the MAX and MIN registers in the presence of a jitterless signal.

Figure 3:
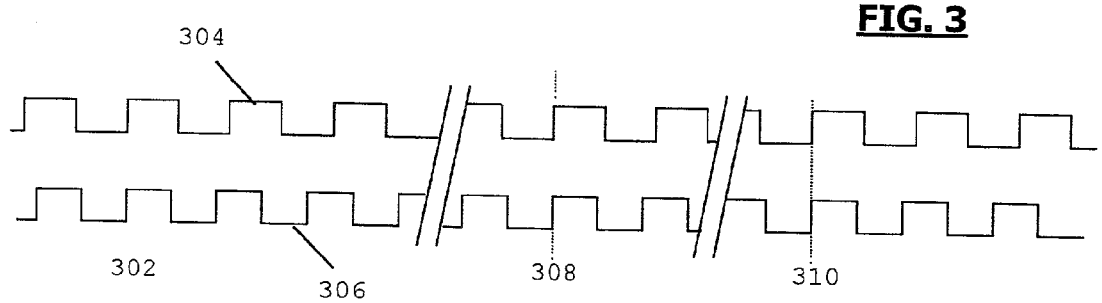
FIG. 3 shows a digital signal waveform diagram illustrating the presence of jitter.

FIG. 3 shows how jitter would affect the MAX and MIN registers.

As can be seen from FIG. 2, if no jitter is present then following the first phase match (causing the starting of the test) at point 202 between the input signal 204 and the reference signal 206, the next coincidence (causing possible updating of the MAX and MIN registers) will always be at the same point 208 and both registers will have the same number (100 for the example above). As can be seen from FIG. 3, if jitter is present then following the first phase match (causing starting of the test) at point 302 between the input signal 304 and the reference signal 306, different numbers will be stored in the MAX and MIN registers: the MIN register will be updated at point 308, and the MAX register will be updated at point 310. The difference between these numbers will be the peak-to-peak amount of jitter in steps equal to the reciprocal of the ratio of the frequency offset, 0.01 (1/100) Unit Intervals (UI) for the above example.

It will be understood that this example limits the technique to being able to measure no more than 1 UI (+/−0.5 UI). It will equally be understood that this limitation may be removed by pre-scaling the input signal with a divider. For example, if the input signal is first divided by 8 (the particular value of this number is not important other than to extend the range) then the method of measurement would have a capability of reading up to 8 UI (+/−4 UI) with the resolution being reduced to 8/100, i.e., 0.08 UI, steps however this reduction can be removed by changing the frequency offset by the same scaling factor.

Similarly, it will be understood that the particular value of the frequency offset is not important for the basic functionality of the technique and can be changed to suit the required resolution.

Figure 4:
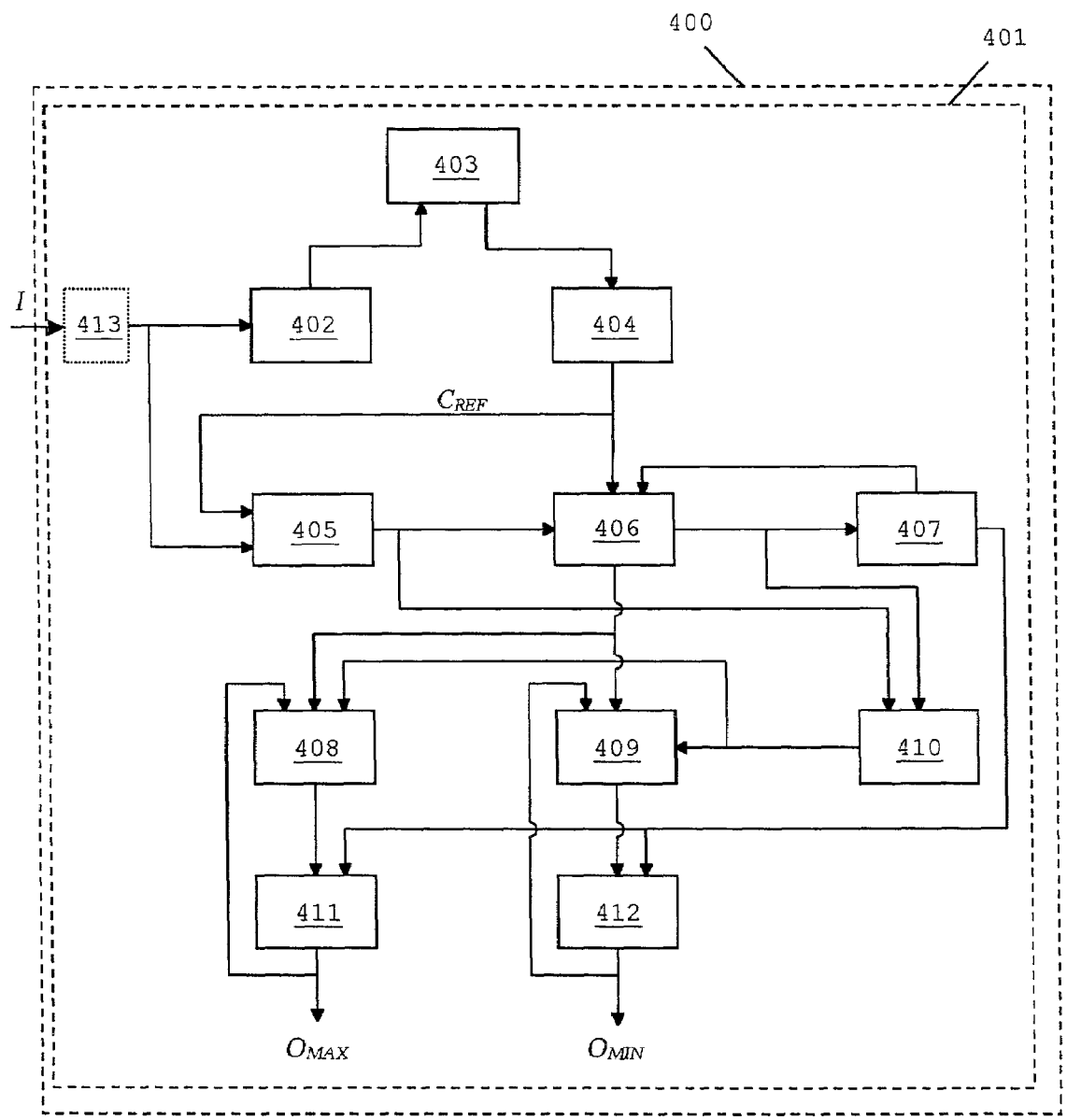
FIG. 4 shows a block schematic diagram of a circuit for measurement of jitter using the method of FIG. 1.

Referring now to FIG. 4, test equipment 400 includes a circuit 401 for measuring, using the method described above, the jitter present on a digital signal of a telecommunications pulse code modulation (PCM) link.

The circuit 401 includes a frequency counter 402 arranged to receive an input digital PCM signal I whose jitter is to be measured. The frequency counter 402 has an output connected to a microprocessor (or microcontroller) 403, which controls a programmable oscillator 404.

The programmable oscillator 404 has an output that is connected to one input of a phase comparator 405, of which another input is arranged to receive the input digital PCM signal I. A 'phase match' output of the phase comparator 405 is connected to the input of a counter 406, which is arranged to connected to receive as its clock input the output signal $C_{REF}$ from the programmable oscillator 404. The counter 406 has an output that is connected to the input of a test cycle counter 407, of which an output is connected to reset the counter 406.

An output of the counter 406 is connected to one input of a maximum comparator 408 and to one input of a minimum comparator 409. A blocking window generator 410 is connected to receive outputs from the phase comparator 405 and from the counter 406, and has an output that is connected to enable comparisons in the maximum comparator 408 and in the minimum comparator 409.

A maximum register 411 is connected to receive at one input thereof the output of the maximum comparator 408. A minimum register 412 is connected to receive at one input thereof the output of the minimum comparator 409. The maximum register 411 and the minimum register 412 have respective reset inputs, which are connected to receive a 'reset registers' signal from the output of the test cycle counter 407. The maximum register 411 has an output, for producing a 'maximum output' signal $O_{MAX}$, which is connected to another input of the maximum comparator 408. The minimum register 412 has an output, for producing a 'minimum output' signal $O_{MIN}$, which is connected to another input of the minimum comparator 409.

As referred to in the discussion of the method above, a pre-scaling divider 413 may be used to divide the input signal I by a desired value so as to increase measurement resolution.

In use of the circuit 401 of the test equipment 400, the frequency of the input signal I is measured by the frequency counter 402 and this measurement is fed to the microprocessor 403. The microprocessor 403 calculates a frequency offset (as will be described in more detail below) and sets the programmable oscillator 404 to produce at its output a reference clock signal $C_{REF}$ of this calculated offset frequency. The microprocessor 403 also controls resetting of the counters, including the test cycle counter 407 (which in turn controls resetting of the maximum register 411 and the minimum register 412), and reads the final values in the maximum and minimum registers; however, for the sake of clarity, links illustrating these functions have been omitted from FIG. 1.

At the start of a measurement cycle, the maximum register 411 is set to zero and the minimum register 412 is set to its maximum possible value (which is greater than twice the phase repeat cycle). Both the counter 406 and the test cycle counter 407 are held in reset until a first phase match is detected. When the phase comparator 405 detects an exact phase match (between the input signal I and the reference clock signal $C_{REF}$) the counter 406 and the test cycle counter 407 are started. Both the counter 406 and the counter 407 increment on each pulse of the reference clock signal $C_{REF}$.

Every time a phase match is detected in the phase comparator 405, if the blocking window generator 410 allows, the instant value of the counter 406 is compared (in the maximum comparator 408 and the minimum comparator 409 respectively) with the maximum register 411 and the minimum register 412. If the value of the counter 406 is greater than the stored value in the maximum register 411, then the maximum register 411 is updated; if the value of the counter 406 is less than the stored value in the minimum register 412, then the minimum register 412 is updated. The blocking window generator 410 only allows matches in the middle of the detection range to update the registers, ensuring that multiple phase matches occurring near the start and end of a measurement cycle are ignored.

When the counter 407 reaches the end of a measurement cycle (twice the calculate number of clocks between phase matches), the counter 406 is reset by the test cycle counter 407 and the next measurement cycle starts. The values in the maximum register 411 and the minimum register 412 are retained and only updated if the comparators deem it necessary as started above.

This process continues with the counter 406 being reset each calculated measurement cycle by the test cycle counter 407 until the completion of the entire test, when the counter 406 is held in reset by the test cycle counter 407 and the microprocessor 403 can read the final values in the maximum register 411 and the minimum register 412. The total peak-to-peak jitter is calculated by the microprocessor subtracting the value in the minimum register 412 from the value in the maximum register 411 and then dividing this difference by the calculated number of clock cycles between phase matches.

As each measurement cycle is started at the calculated phasing point of the input signal, the jitter imposed on the input signal will "move around" this point and over the entire test period the maximum jitter and peak-to-peak jitter will be detected.

It will be understood that the method and apparatus for measurement of jitter described above provide the following advantages:

It does not require analogue circuitry, and because the frequency offset can be large and still function, the reference frequency can be produced by a programmable oscillator. In contrast, the prior art approach of patent publication WO 99/57842 needs to measure both the number of sampling times and the time between them to get both a course reading and a fine reading, whereas the present technique produces a direct reading from two counters (MAX and MIN) which give the peak positive and peak negative jitter measured from the start point of the test.

With the exception of the programmable oscillator and microprocessor the entire circuit can be implemented within a FPGA (reducing cost and increasing reliability), although it is not necessary to do so.

The technique does not rely on having to track the input signal accurately, and although it requires the frequency of this signal to be measured in order to calculate the offset frequency this measurement can be performed using a simple frequency counter within the FPGA.

The technique does not require any parts that are designed to operate at a specific frequency (such as a jitter attenuator or phase locked loop) and therefore this technique can operate over an extremely wide frequency range, limited only by the upper limit of the digital circuitry and the programmable range of the oscillator.

It will be understood that if desired modifications may be made to the examples described above, without departing from the present invention. For example, The programmable oscillator 404 could be replaced by a phase locked loop to produce the frequency offset however this would require analogue circuitry and a jitter attenuator to remove the jitter introduced by the PLL. This would also mean that if the offset and the jitter were to beat then errors would be introduced in the readings.

Further, it will be understood that rather than producing two values (maximum and minimum) of jitter as described above, it is possible to extrapolate the peak-to-peak jitter value from just one value, giving just the peak positive value or peak negative value, but this would reduce the accuracy.

It will further be appreciated that if the invention is to be used at only one frequency which is very accurately produced, then the programmable oscillator could be replaced by a fixed frequency source with a preset offset; however, this would produce errors and restrict the low frequency limit if the input signal was not exactly at the right frequency.

Other possible modifications may occur to person of ordinary skill in this art without departing from the scope of the present invention.

The invention claimed is:

1. A method for measuring jitter in a digital input signal, the method comprising:

producing a digital reference signal having a predetermined frequency offset from that of said digital input signal;

detecting a first occurrence of a predetermined phase relationship between said digital input signal and said digital reference signal;

detecting subsequent occurrence of said predetermined phase relationship between said digital input signal and said digital reference signal; and determining the time difference between said first occurrence and said subsequent occurrence, to determine a measurement of jitter present in said digital input signal.

2. The method of claim 1 wherein the step of producing said digital reference signal comprises:
   measuring the frequency of said digital input signal to produce a frequency measurement; and
   using the frequency measurement to produce said digital reference signal having a frequency which is offset therefrom by a predetermined amount.

3. The method of claim 1 wherein the step of detecting a first occurrence of a predetermined phase relationship between said digital input signal and said digital reference signal and the step of detecting subsequent occurrence of said predetermined phase relationship between said digital input signal and said digital reference signal comprise detecting coincidence of similar edges of said digital input signal and said digital reference signal.

4. The method of claim 1 wherein the step of detecting subsequent occurrence of said predetermined phase relationship between said digital input signal and said digital reference signal comprises:
   detecting over a plurality of said subsequent occurrences a maximum time difference value and a minimum time difference value; and
   determining from said maximum time difference value and said minimum time difference value a total peak-to-peak jitter measurement.

5. The method of claim 4 wherein said predetermined frequency offset is varied between test cycles to facilitate detection of fixed frequency jitter based on a frequency that would beat with a fixed frequency offset.

6. The method of claim 1 further comprising pre-scaling the digital input signal to increase the resolution of jitter measurement.

7. An apparatus for measuring jitter in a digital input signal, the apparatus comprising:
   a receiving arrangement for receiving a digital input signal;
   a reference signal arrangement for producing a digital reference signal having a predetermined frequency offset from that of said digital input signal;
   a phase detecting arrangement for detecting a first occurrence of a predetermined phase relationship between said digital input signal and said digital reference signal and subsequent occurrence of said predetermined phase relationship between said digital input signal and said digital reference signal; and
   a determining arrangement for determining the time difference between said first occurrence and said subsequent occurrence, to determine a measurement of jitter present in said digital input signal.

8. The apparatus of claim 7 wherein said reference signal arrangement comprises:
   a measuring arrangement for measuring the frequency of said digital input signal to produce a frequency measurement; and
   a signal producing arrangement for producing from said frequency measurement said digital reference signal having a frequency which is offset therefrom by a predetermined amount.

9. The apparatus of claim 8 wherein said measuring arrangement comprises a frequency counter.

10. The apparatus of claim 8 wherein said signal producing arrangement comprises a programmable oscillator.

11. The apparatus of claim 7 wherein said phase detecting arrangement comprises an edge detecting arrangement for detecting coincidence of similar edges of said digital input signal and said digital reference signal.

12. The apparatus of claim 7 wherein said phase detecting arrangement comprises:
   a minimum/maximum detecting arrangement for detecting over a plurality of said subsequent occurrences a maximum time difference value and a minimum time difference value; and
   a jitter determining arrangement for determining from said maximum time difference value and said minimum time difference value a total peak-to-peak jitter measurement.

13. The apparatus of claim 12 wherein said minimum/maximum detecting arrangement comprises:
   a counter arrangement driven by said reference signal;
   a maximum register arrangement for holding a value in said counter arrangement when said phase detecting arrangement detects a said second occurrence;
   a maximum comparator arrangement for comparing a value in said maximum register arrangement with a value in said counter arrangement when said phase detecting arrangement detects a said subsequent occurrence and if said counter arrangement value is greater than said maximum register arrangement value storing said counter arrangement value in said maximum register arrangement;
   a minimum register arrangement for holding a value in said counter arrangement when said phase detecting arrangement detects a said subsequent occurrence; and
   a minimum comparator arrangement for comparing a value in said minimum register arrangement with a value in said counter arrangement when said phase detecting arrangement detects a said second occurrence and if said counter arrangement value is less than said minimum register arrangement value storing said counter arrangement value in said minimum register arrangement.

14. The apparatus of claim 7 wherein the apparatus is substantially comprised in a field programmable gate array.

15. The apparatus of claim 7 wherein the apparatus is arranged to sense jitter in a telecommunications pulse code modulation (PCM) signal.

16. The apparatus of claim 7 wherein said predetermined frequency offset is varied between test cycles to facilitate detection of fixed frequency jitter based on a frequency that would beat with a fixed frequency offset.

17. The apparatus of claim 7 further comprising a pre-scaling arrangement for pre-scaling the received digital input signal to increase the resolution of jitter measurement.

* * * * *